United States Patent [19]
Araki et al.

[11] Patent Number: 5,597,644
[45] Date of Patent: Jan. 28, 1997

[54] CERAMIC CIRCUIT BOARD AND PROCESS FOR PRODUCING SAME

[75] Inventors: Hideaki Araki; Junzo Fukuta, both of Nagoya; Masashi Fukaya, Kuwana, all of Japan

[73] Assignee: Sumitomo Metal Ceramics, Inc., Mine, Japan

[21] Appl. No.: 555,402

[22] Filed: Nov. 9, 1995

[30] Foreign Application Priority Data

Nov. 11, 1994 [JP] Japan ................... 6-303069

[51] Int. Cl.$^6$ ........................................ B32B 9/00
[52] U.S. Cl. .................. 428/210; 428/427; 428/428; 428/432; 428/209; 501/2; 501/4; 501/5; 501/6; 501/7; 501/11; 156/89; 427/452
[58] Field of Search ................ 428/210, 427, 428/428, 432, 433, 209; 501/2, 4, 5, 6, 7, 11; 156/89; 427/452

[56] References Cited

U.S. PATENT DOCUMENTS

| | | | |
|---|---|---|---|
| 3,558,346 | 1/1971 | Plumley | 428/432 |
| 3,645,839 | 2/1972 | Veres | 161/193 |
| 3,951,669 | 4/1976 | Malemendier et al. | 106/39.6 |
| 4,002,799 | 1/1977 | Dumesnil et al. | 428/428 |
| 4,246,034 | 1/1981 | Kellberg | 106/53 |
| 4,251,595 | 2/1981 | Dumesnil et al. | 428/426 |
| 4,621,064 | 11/1986 | Matsuura et al. | 501/15 |
| 4,746,578 | 5/1988 | Kondo et al. | 428/432 |
| 4,861,646 | 8/1989 | Barringer et al. | 428/210 |
| 5,124,282 | 6/1992 | Prabhu | 501/5 |

Primary Examiner—Patrick Ryan
Assistant Examiner—Cathy K. Lee
Attorney, Agent, or Firm—Burns, Doane, Swecker & Mathis, LLP

[57] ABSTRACT

A ceramic circuit board comprises a ceramic substrate having a glaze film formed thereon, the glaze film being overlaid with a functional thin film such as a ferromagnetic film serving as a magnetic sensor, for example. The ceramic substrate is made of a low-firing ceramic material such as a glass ceramic material which can be sintered at a temperature below 1000° C. by co-firing with the glaze film. Preferably, the ceramic substrate has a recess on its top surface, and the glaze film is embedded in the recess such that the difference in level between the ceramic substrate and the glaze film is 20 μm or less. The ceramic circuit board can be produced by preparing a plurality of ceramic green sheets from a low-firing ceramic material, laminating the ceramic green sheets after a through-hole or indentation is formed in the uppermost sheet, thereby forming a multilayer ceramic green substrate having a recess on its top surface, filling the recess with a glaze-forming glass material to such a height that the difference in level between the ceramic substrate and the glaze film formed after firing is 20 μm or less, and co-firing the ceramic green substrate and the glaze-forming glass material at a temperature below 1000° C.

18 Claims, 5 Drawing Sheets

CERAMIC CIRCUIT BOARD AND PROCESS FOR PRODUCING SAME

BACKGROUND OF THE INVENTION

This invention relates to a ceramic circuit board comprising a ceramic substrate having a glaze film formed thereon and a process for producing such a ceramic circuit board. The glaze film is subsequently overlaid with a functional film such as a ferromagnetic or conductive film.

A ceramic circuit board having a photolithographically patterned film of a ferromagnetic material, which serves as a magnetoresistive element having a resistivity which varies with magnetic field strength, has found applications as a magnetic sensor or MR head (magneto-resistive head), which is a kind of thin film magnetic head. Such a magnetic sensor is useful for counting revolutions of a part, for example. An MR head is a read only head, but it has a high reproducing output even at a low circumferential velocity since it detects the magnitude of magnetic flux, and it can be used to read a magnetic recording medium having a high recording density.

In a ceramic circuit board having a photolithographically patterned ferromagnetic film on a ceramic substrate, a glaze film having a smooth surface is normally interposed between the ceramic substrate and the ferromagnetic film in order to prevent the ferromagnetic film, particularly where the patterned film has areas in the form of thin lines, from breaking (disconnecting) due to projections or pores which inevitably exist on the surface of the ceramic substrate. The glaze film also minimizes fluctuations in the resistivity of the ferromagnetic film. Similarly, in a ceramic circuit board having, on a ceramic substrate, a conductive film of a metallic material which serves as a heating element, a glaze film is interposed between the ceramic substrate and the conductive film.

In the manufacture of these ceramic circuit boards, a glaze film is first formed on the surface of a ceramic substrate to produce a ceramic circuit board having a glaze film (such a board being hereinafter referred to as "glazed ceramic circuit board"). A functional film such as a ferromagnetic or conductive film is then formed on the glaze film of the glazed ceramic circuit board.

Figure 7:
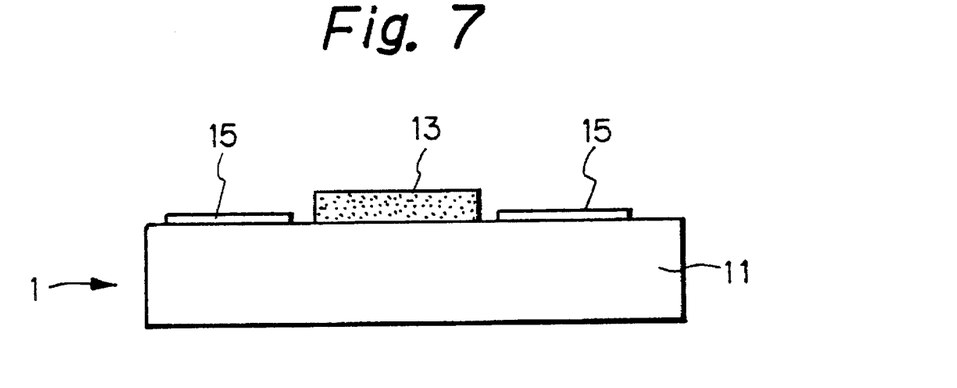
FIG. 7 is a schematic cross section of a conventional ceramic circuit board.

As schematically shown in FIG. 7, a conventional glazed ceramic circuit board has a ceramic substrate 11 usually made of alumina, on which a glaze film 13 and a conductor circuit 15 are formed. Such a glazed ceramic circuit board has conventionally been produced by firing a ceramic green sheet to form a ceramic substrate 11, applying a glaze-forming glass material and a conductive paste onto the substrate by screen printing, and firing again to form a glaze film 13 and a conductor circuit 15 on the substrate.

Figure 9:
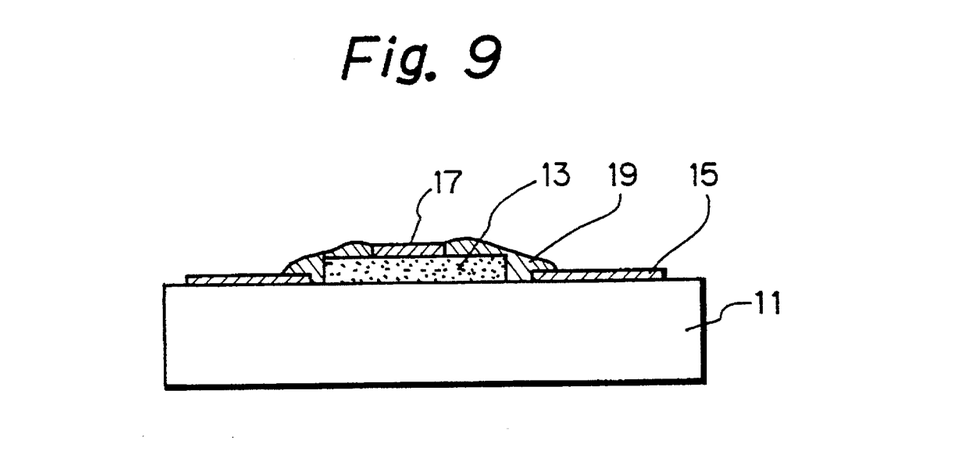
FIG. 9 is a schematic cross section of the conventional ceramic circuit board of FIG. 7 after a connecting circuit is formed to connect a conductor circuit and a ferromagnetic film.

The ceramic circuit board can be used, for example, as a magnetic sensor, after a ferromagnetic material is deposited by sputtering on the glaze film 13 and patterned photolithographically so as to form a ferromagnetic film 17 serving as a magnetic sensor and a connecting circuit 19 is then formed so as to extend from the ferromagnetic film 17 to the conductor circuit 15 and transmit signals generated by the ferromagnetic film to the conductor circuit, as shown in FIG. 9.

However, the above-mentioned conventional glazed ceramic circuit board has the following drawbacks.

Figure 8:
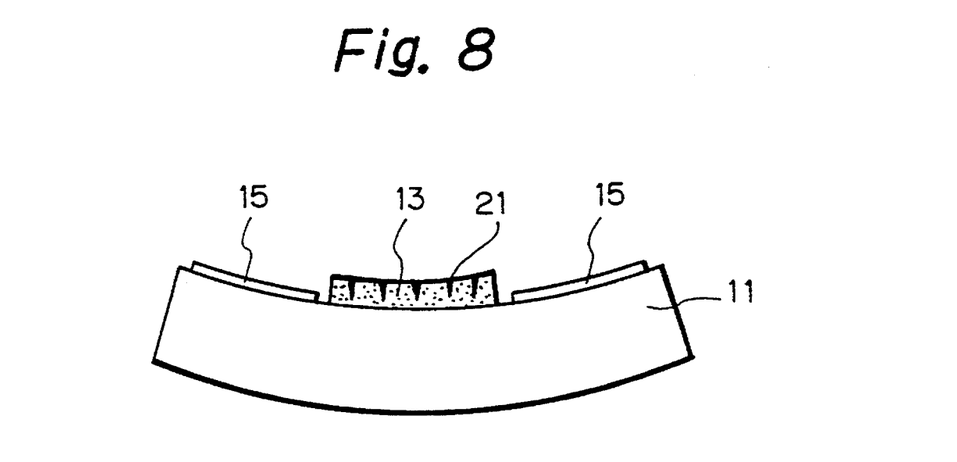
FIG. 8 depicts a problem in the conventional ceramic circuit board of FIG. 7.

First, the glaze film 13 has a coefficient of thermal expansion which is significantly greater than that of the ceramic substrate 11. Therefore, the glaze film undergoes a greater contraction than the substrate does during cooling, which follows firing to form the glaze film and conductor circuit, thereby producing a thermal stress and warpage in the board, as shown in FIG. 8. When a thermal shock is applied to the thermally stressed ceramic circuit board during subsequent processing or in use, cracks 21 may form in the glaze film 13, resulting in disconnection of the ferromagnetic film 17 formed thereon.

Second, the ferromagnetic film 17 formed on the glaze film must have a uniform thickness, since the sensing accuracy of a magnetic sensor is significantly deteriorated if the thickness of the ferromagnetic film varies remarkably. In order to form a ferromagnetic film having a uniform thickness on a glaze film, the glaze film must have a smooth surface with a surface roughness of 0.05 μm Ra or less, which is obtainable only when the glaze film has a sufficient thickness. For this reason, the glaze film 13 is usually formed so as to have a thickness of at least 30 μm, which is substantially greater than the thickness of the conductor circuit 15 which is normally between about 5 μm and about 15 μm.

Figure 10:
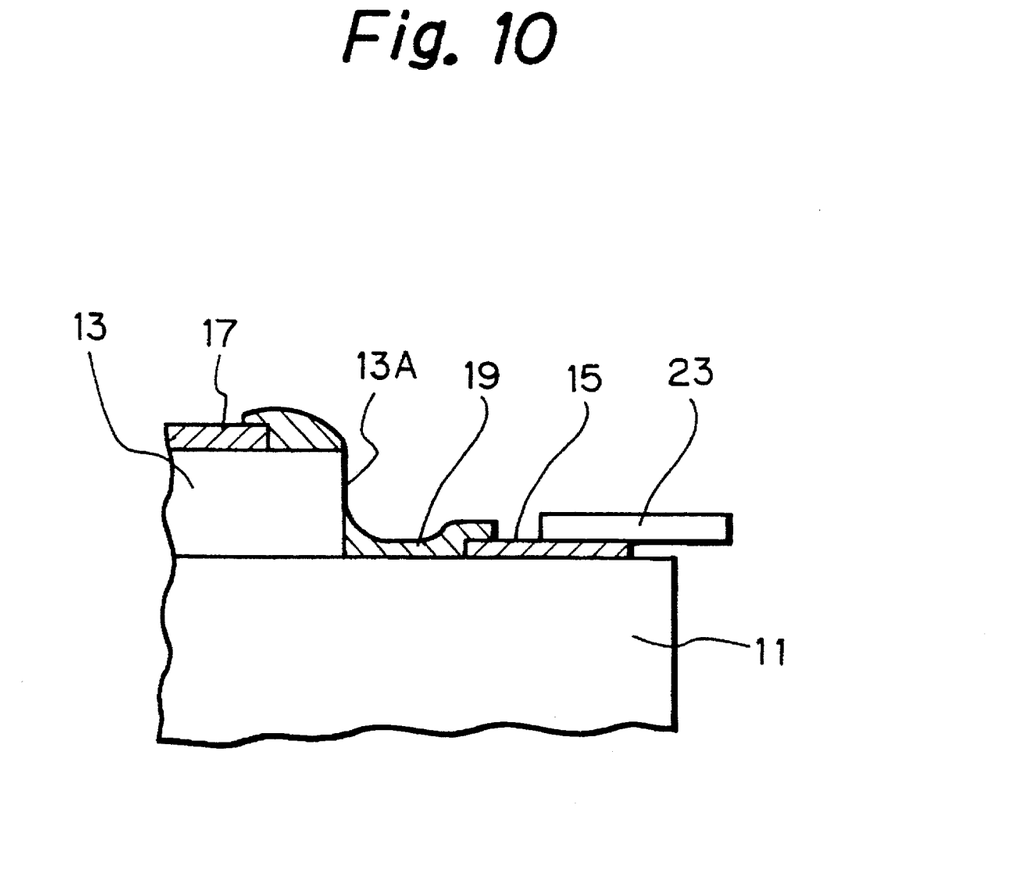
FIG. 10 depicts another problem in the conventional ceramic circuit board of FIG. 7.

Therefore, there is a difference in level of 30 μm or greater between the glaze film 13 and the ceramic substrate 11. As schematically shown in FIG. 10, such a big difference in level causes a connecting circuit 19, which is formed to connect the ferromagnetic film 17 formed on the glaze film 13 to the conductor circuit 15 which is, in turn, connected to external connecting pins 23, to become very thin and at times interrupted or disconnected on the peripheral wall 13A of the glaze film. This significantly reduces the reliability of connection by the connecting circuit 19. It is possible to alleviate this problem by forming the glaze film so as to have a gently declining peripheral wall rather than the depicted vertical one. Such a glaze film, however, will occupy an increased area on the ceramic substrate and hence hinders the reduction in size of ceramic circuit boards, which is always a goal in the art.

SUMMARY OF THE INVENTION

It is an object of this invention to provide a glazed ceramic circuit board which is free from the above-described problems.

A more specific object of this invention is to provide a glazed ceramic circuit board comprising a ceramic substrate having a glaze film formed thereon, which is less susceptible to cracking in the glaze film when subjected to thermal shocks and which ensures the formation of any connecting circuit over the glaze film without disconnection of the circuit.

A further object of this invention is to provide a process for producing such a ceramic circuit board.

These objects can be achieved by using a low-firing ceramic material which can be sintered at a temperature below 1000° C. in the formation of a ceramic substrate, co-firing the substrate and a glaze film formed thereon at a temperature below 1000° C., and preferably providing the substrate with a recess in which the glaze film is at least partly embedded so as to minimize the difference in level between the substrate and the glaze film.

In one aspect, the present invention provides a ceramic circuit board comprising a ceramic substrate having a glaze film formed thereon, wherein the ceramic substrate and the glaze film are made by co-firing of their respective materials both capable of being sintered at a temperature below 1000° C. The ceramic substrate preferably has a recess on its top surface, and the glaze film is embedded in the recess such that the difference in level between the ceramic substrate and the glaze film is small enough to ensure that a connecting circuit can be formed over the glaze film without disconnection of the connecting circuit at the periphery of the glaze film. The difference in level is preferably 20 μm or less.

In another aspect, there is provided a process for producing a ceramic circuit board having a glaze film on a ceramic substrate, comprising preparing a plurality of ceramic green sheets from a ceramic material which can be sintered at a temperature below 1000° C., laminating the ceramic green sheets under pressure after a through-hole or indentation is formed in the uppermost sheet, thereby forming a multilayer ceramic green substrate having a recess on its top surface, filling the recess with a glaze-forming glass material to such a height that the difference in level between the ceramic substrate and the glaze film formed after firing is 20 μm or less, and co-firing the ceramic green substrate and the glaze-forming glass material at a temperature below 1000° C. to give a ceramic circuit board in which the glaze film is at least partly embedded in the ceramic substrate.

Other objects, features, and advantages of this invention will be apparent to those skilled in the art from the following description.

DESCRIPTION OF EMBODIMENTS OF THE INVENTION

Figure 1:
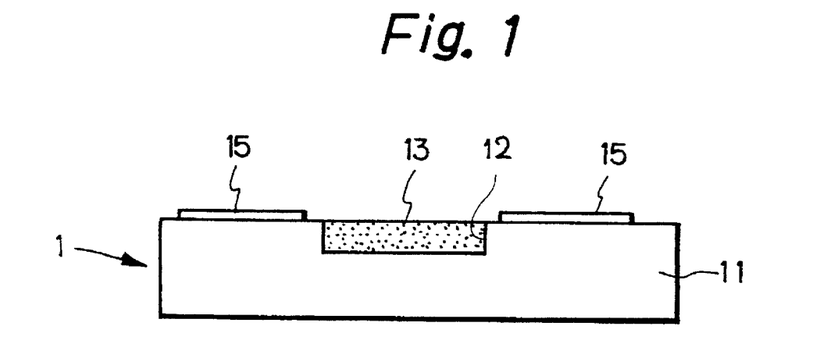
FIG. 1 is a schematic cross section of a ceramic circuit board according to this invention.

Referring to FIG. 1, a ceramic circuit board 1 according to this invention comprises a ceramic substrate 11 and a glaze film 13 formed on the substrate. The ceramic substrate 11 has a recess 12 on its top surface, and the glaze film 13 is at least partly embedded in the recess. This configuration ideally makes it possible for the glaze film 13 to be flush with the ceramic substrate 11 so as to nullify the difference in level between the substrate and glaze film. Usually, a conductor circuit 15 is formed around but apart from the glaze film 13 on the ceramic substrate 11.

In accordance with the present invention, the difference in level between the substrate and glaze film is small enough to ensure that a connecting circuit can be formed over the glaze film without disconnection of the connecting circuit at the periphery of the glaze film. The difference in level should be 20 μm or less, preferably 10 μm or less, more preferably 5 μm or less, and most preferably substantially zero. When the surface of the glaze film or ceramic substrate is not flat, the mean value of the varying level is taken to determine the difference in level. If the difference in level is more than 20 μm, as shown in FIG. 10, a connecting circuit formed over the glaze film so as to connect a ferromagnetic film formed on the glaze film and the conductor circuit is less reliable and tends to be interrupted or disconnected at the periphery of the glaze film.

The recess on the top surface of the ceramic substrate can conveniently be formed by the green sheet laminating method as described below in detail.

According to the present invention, the ceramic substrate 11 and the glaze film 13 are both made of materials which can be sintered at a temperature below 1000° C., and they are formed by co-firing (simultaneous firing).

Ceramic materials which can be sintered at a temperature below 1000° C. are called "low-firing ceramic materials" before firing or "low temperature-fired ceramics" after firing. The ceramic material from which the ceramic substrate is formed can be selected from known low-firing ceramic material systems taking account of physical properties such as thermal conductivity, dielectric constant, and specific resistivity required for the substrate.

The ceramic substrate is preferably made of a glass ceramic material, which is a class of low-firing ceramic materials consisting of a boron-containing glass powder and an alumina powder. Examples of the boron-containing glass powder include $Na_2O$—$Al_2O_3$—$B_2O_3$—$SiO_2$, $CaO$—$Al_2O_3$—$B_2O_3$—$SiO_2$, and $MgO$—$Al_2O_3$—$B_2O_3$—$SiO_2$ based glass powders. The weight ratio of the boron-containing glass to alumina is usually from about 90:10 to about 30:70 and preferably from about 80:20 to about 50:50.

The glaze film is commonly made of a glass material which softens at a temperature below 800° C. so as to give a smooth surface. Therefore, a glaze-forming glass material can normally be sintered at a temperature below 1000° C. Suitable glass materials used to form the glaze film are lead-containing glass materials such as those based on $PbO$—$B_2O_3$—$SiO_2$ and $PbO$—$B_2O_3$—$ZnO$. Such a glaze-forming glass material is normally used in the form of a paste.

The ceramic circuit board is produced by initially forming a ceramic green substrate having a recess on its top surface, using a suitable low-firing ceramic material. Usually, a conductive paste is then applied on the same surface so as to form a conductor circuit around a glaze film after firing. Thereafter, a glaze-forming glass material is applied so as to fill the recess, and the ceramic green substrate is fired at a temperature below 1000° C. to sinter it simultaneously with the glaze-forming material and the previously applied conductive paste.

Figure 2:
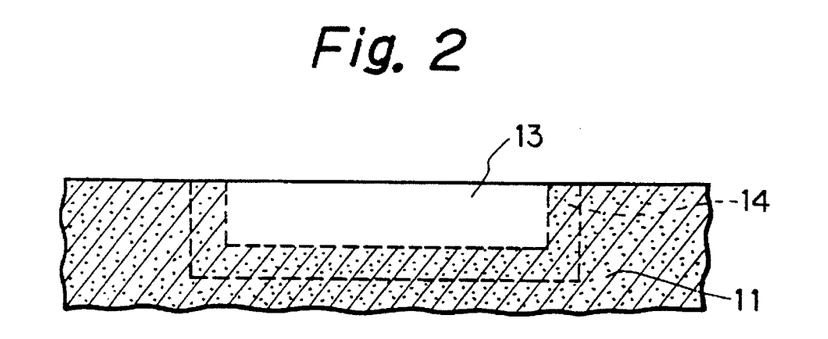
FIG. 2 is an enlarged cross section of a portion of the ceramic circuit board.

During such co-firing, the glaze-forming glass material is partly diffused into the surrounding ceramic material, thereby forming a glass-diffused interfacial layer 14 at the interface between the ceramic substrate 11 and glaze film 13, as depicted in FIG. 2. The glass-diffused interfacial layer 14 has a coefficient of thermal expansion which is intermediate between those of the ceramic substrate 11 and glaze film 13. As a result, the thermal stress imposed on the glaze film during cooling subsequent to co-firing is reduced, and the glaze film is prevented from cracking even when a thermal shock is exerted on the film during subsequent processing or during use.

As described above, the glaze film 13 should have a smooth surface. Preferably it has a surface roughness of 0.05 µm Ra or less, and more preferably 0.03 µm Ra or less. In order to obtain a glaze film having such a small surface roughness after firing, it is normally necessary that the thickness of the fired glaze film be at least 30 µm and preferably in the range of 30–60 µm. Due to shrinkage of the glaze-forming glass material in paste during firing, the thickness of the fired glaze film will be reduced, e.g., by about 10–30%, relative to the thickness of the glass material when applied. Therefore, the glaze-forming glass material should be applied in a thickness greater than the desired thickness for the glaze film, allowing for shrinkage during firing.

The ceramic green sheet also shrinks during firing, thereby reducing the depth of the recess formed thereon. Therefore, the depth of the recess formed on the green ceramic substrate and the thickness of the glaze-forming glass material applied in the recess should be selected, allowing for the shrinkages of these materials during firing, such that the difference in level between the glaze film and the ceramic substrate after firing is 20 µm or less, and preferably as small as possible.

FIGS. 3(a) to 3(e) illustrate a process for producing a ceramic circuit board according to the present invention using the green sheet laminating method.

Figure 3A:
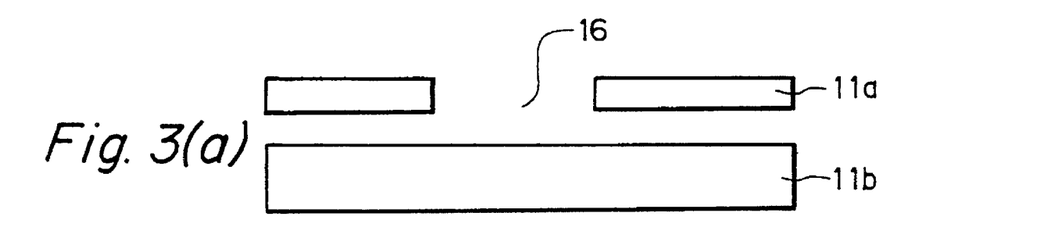
FIGS. 3(a) to 3(e) illustrate a process for producing a ceramic circuit board according to this invention.

A plurality of green sheets, two sheets 11a and 11b in this case, all made of a low-firing ceramic material are prepared in a conventional manner. For example, a powder of a low-firing ceramic material such as a glass-ceramic material is mixed with minor amounts of a binder and a plasticizer in a solvent to form a slurry. The binder is selected from various organic resins including acrylic resins and butyral resins. The plasticizer can be selected from phthalate esters and polyalkylene glycols. The solvent is usually an organic solvent. The resulting slurry is cast into sheets by the doctor blade technique and the sheets are dried with or without heating so as to remove most of the solvent, leaving green sheets.

The green sheet 11a constituting the uppermost layer when laminated has a through-hole 16, which forms a recess on the top surface of the laminate (FIG. 3a). The through-hole can be formed by punching with a die at the same position and with the same shape as the glaze film to be formed on the substrate. The thickness of the green sheets is preferably in the range of 50–1500 µm and more preferably 100–1000 µm, except for the uppermost green sheet 11a which determines the depth of the recess. The thickness of the uppermost green sheet 11a is selected such that its thickness after firing becomes within ±20 µm of the thickness of the glaze film after firing.

Alternatively, the recess may be formed on the uppermost green sheet 11a by indentation, such as by forcing a die partway through the sheet. The depth of the indentation is selected such that its depth after firing is within ±20 µm of the thickness of the glaze film after firing. In such a case, the thickness of the uppermost green sheet 11a is not critical as long as it is greater than the depth of the indentation, since the depth of the recess does not depend on the thickness of the uppermost green sheet.

Figure 3B:
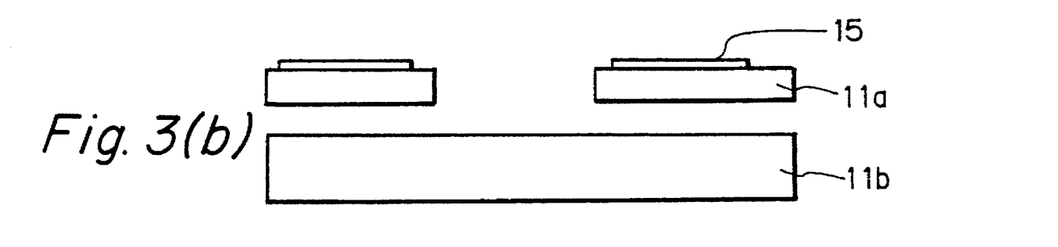

Subsequently, a conductive paste is applied to the surface of the uppermost green sheet 11a, usually by screen printing, so as to form a desired conductor circuit pattern 15 around the through-hole 16 (or indentation) (FIG. 3b). Since a low-firing ceramic material is used to prepare the green sheets, there is no need to use a refractory metal such as Mo or W in the conductive paste, but a low-melting metallic material such as Au, Ag, Ag/Pd, Cu, or Ni can advantageously be used. An Ag/Pd-based paste is particularly preferred.

Figure 3C:
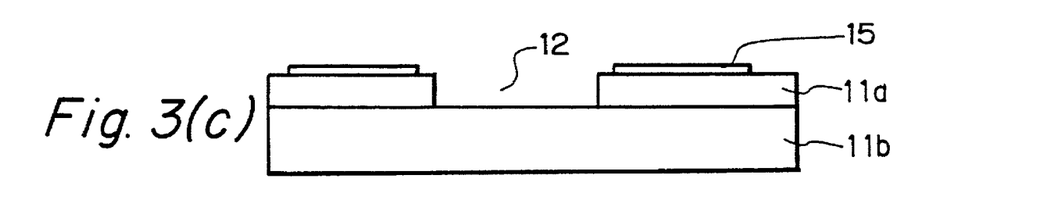

The green sheets are then laminated and pressed with the green sheet 11a having through-hole 16 (or indentation) uppermost, thereby forming a multilayer ceramic green substrate having a recess 12 on the top surface thereof (FIG. 3c). The pressing is usually performed while heating, such as at 80°–120° C. for 10–120 seconds under pressure of 30–200 kg/cm$^2$.

Figure 5A:
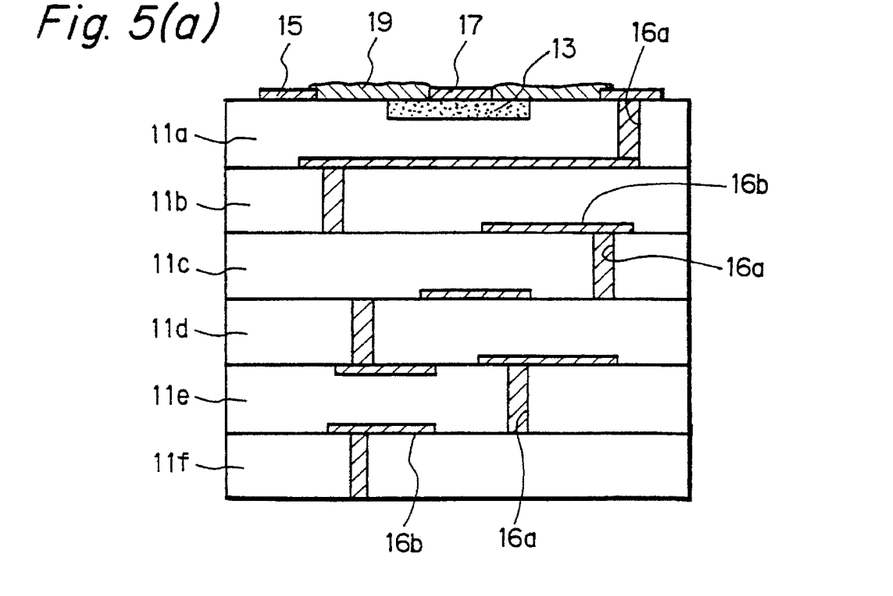
FIGS. 5(a) and 5(b) are schematic cross sections of further embodiments of the ceramic circuit board according to this invention.

In the embodiment shown in FIGS. 3(a) to 3(e), the ceramic green sheet consists of two layers 11a and 11b, but it may comprise three or more layers, as shown in FIG. 5(a). In the latter case, as well recognized to those skilled in the art, one or more through-holes 16a are usually formed in each layer, and a conductive paste, e.g., an Ag-based paste, fills the through-holes and/or is applied to form a desired conductor circuit pattern 16b on the surface of one or more of these layers 11a–11f before lamination, so as to establish electrical conduction between adjacent layers.

Figure 5B:
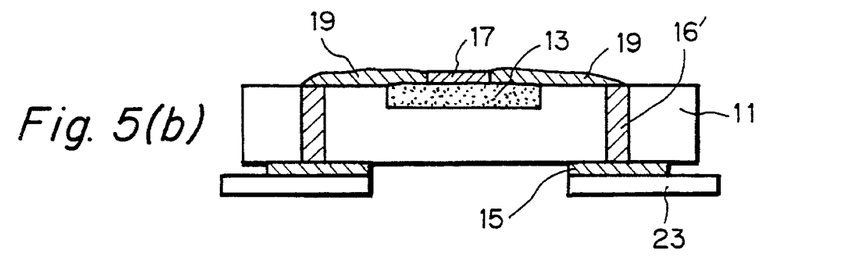

In another embodiment, the conductive paste may be applied to the surface opposite to the glaze film, thereby forming a conductor circuit 15 on the lower surface of the ceramic substrate 11, as shown in FIG. 5(b). This configuration is advantageous in order to reduce the size of the ceramic circuit board. In this case, at least one through-hole 16' filled with a conductive paste should be formed in the ceramic substrate 11 in order to connect a functional film 17 formed on the glaze film 13 to the conductor circuit 15 via a connecting circuit 19.

Figure 3D:
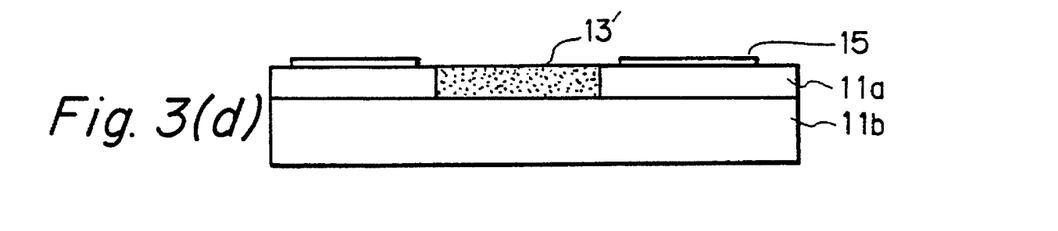

The recess 12 formed on the top surface of the laminated ceramic green substrate is filled with a glaze-forming glass material 13' by an appropriate technique such as screen printing (FIG. 3d). The glaze-forming glass material is usually in the form of a paste containing minor amounts of a binder and an organic solvent, and it fills the recess to such a height that the difference in level between the glaze film and the ceramic substrate after firing is 20 µm or less and that the glaze film formed by firing preferably has a thickness of at least 30 µm.

Instead of forming a recess and filling it with a glaze-forming glass material, it is possible to apply a glaze-forming glass material of a desired shape on a flat surface (with no recess) of the ceramic green substrate, and then press the green substrate between two pressing plates under a pressure sufficient to cause the glaze-forming glass material applied to the green substrate to penetrate into the green substrate, whereby the glaze-forming glass material is at least partly embedded in the green substrate. In this case, the conductor circuit may also be pressed and embedded in the green substrate, particularly when the pressure is very high. This method, however, is somewhat difficult to precisely control the shape and thickness of the glaze film and the above-described difference in level.

Figure 3E:
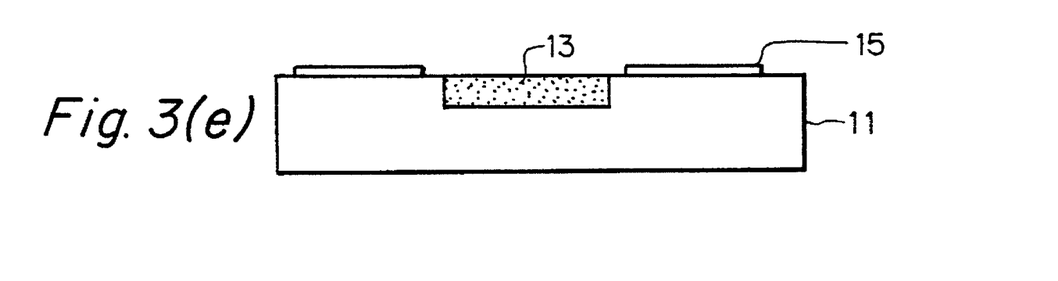

Finally, the laminated ceramic green substrate is fired to sinter it simultaneously with the glaze-forming glass material and the conductive paste, thereby forming a ceramic circuit board according to the present invention, which is made of a ceramic substrate 11 having a glaze film 13 at least partly embedded therein and a conductor circuit 15 formed thereon around the glaze film (FIG. 3e).

The firing is conducted at a temperature below 1000° C. Such a low firing temperature is possible because the ceramic substrate is formed from a low firing ceramic material, thereby making it possible to co-fire the ceramic substrate and the glaze film. Since the glaze-forming glass material contains PbO which is susceptible to reduction, the firing is preferably performed in an oxidizing atmosphere such as air.

Figure 4:
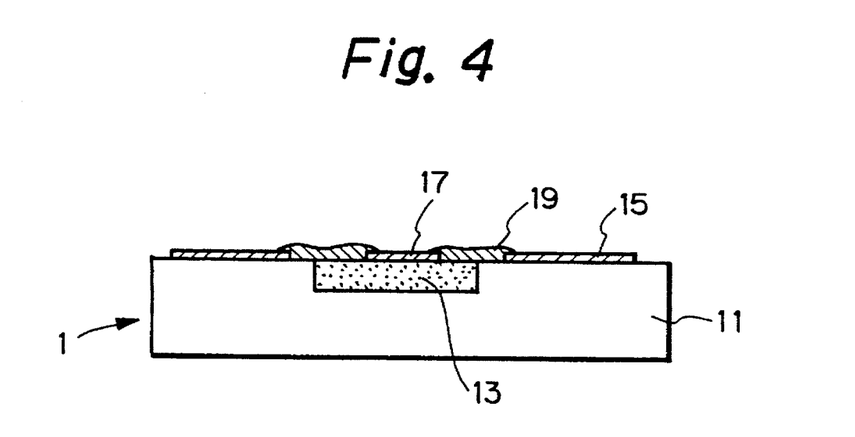
FIG. 4 is a schematic cross section of a ceramic circuit board according to this invention after a connecting circuit is formed to connect a conductor circuit and a ferromagnetic film.

As shown in FIG. 4, a functional film 17 such as a ferromagnetic film serving as a magnetic sensor is subsequently formed atop the glaze film 13 which appears on the top surface of the resulting ceramic circuit board 1. Suitable materials for forming the ferromagnetic film are soft magnetic materials including nickel alloys such as permalloy (Ni/Fe-based alloy) and Ni—Co alloy. The functional film 17 may be a film of a conductive material, such as Ni, Mo, Au, or its alloy, and it serves as a heating element.

The ferromagnetic film or other functional film can be formed by sputtering, vapor deposition including CVD (chemical vapor deposition), ion plating, or similar technique, and it may be patterned by an appropriate technique such as photolithography. The thickness of the functional film is usually in the range of 0.01–0.3 µm.

A connecting circuit 19 is then formed so as to connect the ferromagnetic film 17 to the conductor circuit 15, thereby making it possible to transmit signals generated by the magnetic film 17 to the conductor circuit 15. The connecting circuit may be formed from a metallic material having a high conductivity, e.g., aluminum.

In accordance with the present invention, since the difference in level between the glaze film 13 and the ceramic substrate 11 is eliminated or reduced to 20 µm or less, it is possible to prevent a significant reduction in thickness or disconnection of the connecting circuit at the periphery of the glaze film. As a result, the reliability of the ceramic circuit board is remarkably improved.

Furthermore, the thickness of the glaze film can be increased sufficiently to attain a desired surface smoothness without involving a corresponding increase in the difference in level between the glaze film and the ceramic substrate. Therefore, it is possible to readily form a glaze film having a sufficient thickness and good surface smoothness, and more particularly a thickness of 30 µm or greater and a surface roughness of 0.05 µm Ra or less, while maintaining the above-described difference in level at 20 µm or less. As a result, a thin functional film with a uniform thickness can be formed on the glaze film having a smooth surface, thereby preventing the functional film from having deteriorated performance caused by non-uniformity of film thickness.

Moreover, since the glaze film and the ceramic substrate are formed by co-firing in such conditions that the glaze film is at least partly embedded in the ceramic substrate, a glass-diffused interfacial layer having a coefficient of thermal expansion which is intermediate between those of the glaze film and the ceramic substrate is formed at the interface of the glaze film and the ceramic substrate, thereby preventing the glaze film from cracking when subjected to a thermal shock and improving the bonding strength between the glaze film and the ceramic substrate.

In accordance with the process of the present invention, the dimensions and shape of the glaze film can be controlled easily and accurately by filling a recess, which has been formed on the surface of the ceramic green substrate using the green sheet laminating method, with a glaze-forming glass material, since it is easy to form a recess which is accurate with respect to both dimensions and location by that method.

The following examples are presented to further illustrate the present invention. These examples are to be considered in all respects as illustrative and not restrictive. All percents are by weight unless otherwise indicated.

EXAMPLE 1

Ceramic circuit boards each having a two-layered ceramic substrate were prepared by the green sheet laminating method shown in FIGS. 3(a) to 3(e) in the following manner.

A low-firing glass ceramic material which was a mixture of 60% of CaO—$Al_2O_3$—$SiO_2$—$B_2O_3$ glass powder and 40% of an alumina powder was mixed with minor amounts of an acrylic resin as a binder and dibutyl phthalate as a plasticizer in a mixed xylene/n-butanol solvent to give a slurry. The slurry was cast into sheets by the doctor blade technique and dried at 100° C. to form a 60 µm-thick ceramic green sheet to be used as the upper layer and a 600 µm-thick ceramic green sheet to be used as the lower layer. These sheets were cut into 150 mm squares.

A 3 mm square through-hole was punched in the center of each 60 µm-thick square green sheet for the upper layer, and a commercially-available Ag/Pd-based conductive paste was applied to one surface of the green sheet around the through-hole by screen printing to give a predetermined pattern having a thickness of 10 µm after firing. The green sheet for the upper layer was then placed on a 600 µm-thick square green sheet for the lower layer in such a manner that the surface of the upper layer printed with the conductive paste faced away from the lower layer. The resulting laminate was hot-pressed at 100° C. and 50 kg/cm² to give a 660 µm-thick multilayer ceramic green substrate having a 60 µm-deep recess on its top surface.

After the recess of the ceramic green substrate was filled with a PbO—$B_2O_3$—$SiO_2$-based glass paste (which is a glaze-forming glass material) to a thickness of 60 µm (Sample 1), 40 µm (Sample 2), or 80 µm (Sample 3) by screen printing, the green substrate was fired, along with the conductive paste and glass paste applied thereto, for 20 minutes in air at 900° C., yielding a ceramic circuit board having a glaze film formed in the recess on the ceramic substrate and a conductor circuit formed on the same surface of the substrate as the recess.

Figure 6A:
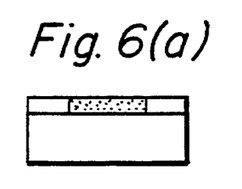
FIGS. 6(a) to 6(f) schematically show cross sections of portions of ceramic circuit boards prepared in the example.
Figure 6B:
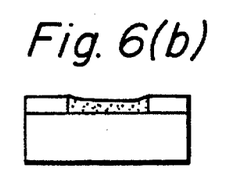
Figure 6C:
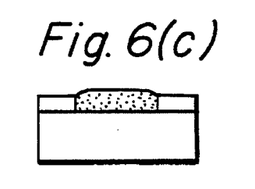

The resulting ceramic circuit boards are schematically shown in FIGS. 6(a) to 6(c), which illustrate the relationship between the recess and the level of the glaze film formed therein.

Figure 6D:
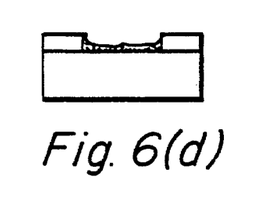
Figure 6E:
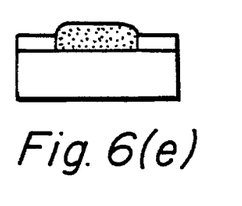

For comparison, similar ceramic circuit boards were prepared in the same manner as described above except that the glass paste was applied in the recess to a thickness of 20 µm (Sample 4) or 100 µm (Sample 5) and the resulting boards are schematically shown in FIGS. 6(d) and 6(e), respectively.

The thickness of the fired glaze film of each of these ceramic circuit boards was measured on a scanning electron micrograph of the board, while the surface roughness (Ra value) of the glaze film was determined using a surface roughness meter. The results are shown in Table 1 along with the thickness of the glass paste applied in the recess.

During firing, the 60 µm-thick upper layer of the multilayer ceramic green substrate shrunk to a thickness of 50 µm, and hence the recess formed in the fired ceramic substrate had a depth of 50 μm. The difference in level between the glaze film and the ceramic substrate, which was calculated by subtracting the depth of the recess (=50 μm) from the thickness of the glaze film, is also given in Table 1.

As can be seen from Table 1, the glass paste and the green sheet shrunk to the same degree during firing in this example, and when the glass paste applied had a thickness of 60 μm, that is the same dimension as the depth of the recess before firing, the resulting ceramic circuit board had no difference in level between the glaze film and ceramic substrate, or the glaze film is flush with the ceramic substrate, as shown in FIG. 6(a).

The values for coefficient of thermal expansion were $5.5 \times 10^{-6}$/K for the ceramic substrate, $9.5 \times 10^{-6}$ for the glaze film, and $7.5 \times 10^{-6}$/K for the glass-diffused interfacial layer.

Figure 6F:
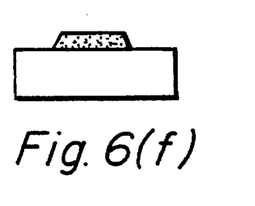

For further comparison, the glass paste was applied by screen printing onto a flat surface of a 600 μm-thick green sheet, which was the same sheet as the lower green sheet layer used in the above and which had a predetermined pattern formed of the Ag/Pd-based conductive paste. The thickness of applied glass paste was 20 μm (Sample 6) or 60 μm (Sample 7). The green sheet was then fired under the same conditions as described above, yielding a ceramic circuit board having a raised glaze film, as shown in FIG. 6(f). The thickness of the fired glaze film and the difference in level of these boards are also shown in Table 1.

The disconnection ratio of each of these ceramic circuit boards was evaluated in the following manner and is also shown in Table 1.

As shown in FIG. 4, a 0.1 μm-thick Ni film as a conductive film 17 was deposited by sputtering on the glaze film 13 of each ceramic circuit board having a conductor circuit 15, and it was processed by a photolithographic method to give a circuit pattern. An aluminum connecting circuit 19 was then formed by vapor deposition followed by photolithographical processing so as to connect the Ni film 17 to the conductor circuit 15. A given number of ceramic circuit boards fabricated as above were subjected to a thermal cycling test in which the boards were exposed to 100 cycles of a predetermined thermal pattern having temperatures which varied from −40° C. to +150° C. in each cycle. The boards were then examined for electrical connection between the Ni film and the conductor circuit.

TABLE 1

| Sample No. | Glaze Film Thickness (μm) Before Firing | Glaze Film Thickness (μm) After Firing | Difference in Level Between Glaze Film and Substrate (μm) | Surface Roughness of glaze Film (Ra) (μm) | Disconnection Ratio[1] |
|---|---|---|---|---|---|
| 1 | 60 | 50 | 0 | 0.01 | 0/60 |
| 2 | 40 | 33 | −17 | 0.02 | 0/20 |
| 3 | 80 | 67 | +17 | 0.01 | 0/20 |
| 4 | 20 | 17 | −33 | 0.11 | 5/20 |
| 5 | 100 | 83 | +33 | 0.005 | 1/20 |
| 6 | 20 | 17 | +17 | 0.12 | 4/20 |
| 7 | 60 | 50 | +50 | 0.02 | 2/20 |

[1]Number of isconnected samples/Number of Tested Samples

As can be seen from Table 1, after application of repeated thermal shocks, no disconnection occurred in ceramic circuit boards of Samples 1 to 3 according to the present invention in which the difference in level between the ceramic substrate and the glaze film was 20 μm or less. In the ceramic circuit board of Sample 6 where the glaze film was formed on a flat surface of the ceramic substrate, disconnection occurred even when the difference in level was 20 μm or less. This disconnection is thought to be due to a small thickness (17 μm) of the glaze film, which is insufficient to provide the glaze film with a smooth surface, and pores and fine projections were formed on the surface of the glaze film, thereby causing disconnection of the overlaid Ni film.

EXAMPLE 2

A 0.3 mm-thick ceramic green sheet based on the low-firing glass ceramic material consisting of 60% of CaO—$Al_2O_3$—$SiO_2$—$B_2O_3$ glass powder and 40% of an alumina powder was prepared in the same manner as described in Example 1, and a PbO—$B_2O_3$—$SiO_2$-based glaze-forming glass paste was printed on the flat surface of the green sheet to a thickness of 45 μm after firing. The green sheet and the printed glass paste were co-fired at 900° C. to form a ceramic substrate having a raised glaze film thereon as shown in FIG. 6(f). It was confirmed by scanning electron micrography that a glass-diffused interfacial layer was formed between the ceramic substrate and the glaze film. The values for coefficient of thermal expansion of the ceramic substrate, glaze film, and glass-diffused interfacial layer were the same as those described in Example 1. The formation of the interfacial layer serves to reduce the thermal stress imposed on the glaze film during cooling after co-firing. The glaze film had a surface roughness of 0.03 μm Ra.

EXAMPLE 3

A ceramic circuit board was prepared in the same manner as described in Example 2 except that a conductive paste was also printed on the flat surface of the green sheet in addition to the glaze-forming glass paste, and that the ceramic green sheet (to which the glass paste and the conductive paste had been applied) was pressed between a pair of pressing plates so as to cause the raised glass paste to penetrate into the green sheet before co-firing of the green sheet, glass paste, and conductive paste at 900° C.

The resulting glaze film had a thickness of 45 μm, but the difference in level between the glaze film and the ceramic substrate was reduced to 4 μm due to pressing before co-firing, thereby making it possible to form a connecting circuit over the glaze film without disconnection of the circuit. The surface roughness of the glaze film was 0.03 μm Ra.

EXAMPLE 4

Multilayered ceramic circuit boards as shown in FIG. 5(a) were fabricated by the green sheet laminating method. Six green sheets 11a to 11f prepared in the same manner as described in Example 1 were laminated after through-holes 16a filled with a conductive paste and a conductor circuit pattern 15 and 16b printed with a conductive paste had been formed in each green sheet.

In Sample 1, the resulting laminate was pressed with heating to bond the laminate, and a glaze-forming glass paste which was the same as used in Example 1 was then printed on the flat top surface of the pressed laminates to give a thickness of 45 μm after firing. In Sample 2, the laminate was initially printed on its top flat surface with the glaze-forming glass paste to the same thickness as above and then pressed with heating, thereby causing the printed glaze-forming paste to penetrate into the uppermost green sheet during pressing. The green sheets and the glaze-forming glass paste were then co-fired at 900° C. to form multilayered ceramic circuit boards of Samples 1 and 2.

As a control, in Sample 3, a six-layered laminate prepared in the same manner as described above was initially fired at 900° C. before it was printed on its top flat surface with a glaze-forming glass paste to the same thickness as above and fired again.

The resulting co-fired ceramic circuit boards according to the present invention (Samples 1 and 2) and twice-fired ceramic circuit board as a control (Sample 3) were tested-for disconnection of a connecting circuit by forming a ferromagnetic film 17 and a connecting circuit 19 in generally the same manner as described in Example 1 and subjecting the test samples to a thermal cycling test in which the boards were exposed to 10 cycles of a predetermined thermal pattern having temperatures which varied from 25° C. to 230° C. in each cycle. The test results are shown in Table 2,

TABLE 2

| Sample No. | Co-Firing | Glaze Film Fired | | | | % of Disconnection in Connecting Circuit |
|---|---|---|---|---|---|---|
| | | Thickness (μm) | Difference in Level (μm) | Surface Roughness (μm Ra) | % Cracked in Thermal Cycle Test | |
| 1 | Yes | 45 | 45 | 0.007 | 0 | 1.8 |
| 2 | Yes | 45 | 12 | 0.007 | 0 | 0 |
| 3 | No | 45 | 45 | 0.007 | 4.3 | 1.8 |

As can be seen from Table 2, co-fired boards of Samples 1 and 2 withstood the thermal shocks imposed during the thermal cycling test, and no cracks were found in their glaze films. In contrast, cracking occurred to an appreciable degree in Sample 3 which was not co-fired. Similarly to the results of Example 1, disconnection of the connecting circuit could be completely prevented when the difference in level between the glaze film and the substrate was 20 μm or less by embedding the glaze film in the substrate at least partly.

It will be appreciated by those skilled in the art that numerous variations and modifications may be made to the invention as described above with respect to specific embodiments without departing from the spirit or scope of the invention as broadly described.

What is claimed is:

1. A ceramic circuit board comprising a ceramic substrate having a glaze film formed thereon, wherein the ceramic substrate and the glaze film are made by co-firing of a ceramic green substrate and a glaze-forming glass material both capable of being sintered at a temperature below 1000° C.

2. The ceramic circuit board of claim 1, wherein the glaze film has a surface roughness of 0.05 μm Ra or less.

3. The ceramic circuit board of claim 1, wherein the glaze film has a thickness of 30 μm or greater.

4. The ceramic circuit board of claim 1, wherein the ceramic substrate is formed of a glass ceramic consisting essentially of a boron-containing glass and alumina.

5. The ceramic circuit board of claim 4, wherein the boron-containing glass is selected from $Na_2O-Al_2O-B_2O_3-SiO_2$, $CaO-Al_2O_3-B_2O-SiO_2$, and $MgO-Al_2O-B_2O_3-SiO_2$ based glasses.

6. The ceramic circuit board of claim 1, wherein the glaze film is overlaid with a ferromagnetic film or a conductive film.

7. A ceramic circuit board comprising a ceramic substrate having a glaze film formed thereon, wherein the ceramic substrate and the glaze film are made by co-firing of a ceramic green substrate and a glaze-forming glass material both capable of being sintered at a temperature below 1000° C., the ceramic substrate has a recess on its top surface, and the glaze film is embedded in the recess such that the difference in level between the ceramic substrate and the glaze film is small enough to ensure that a connecting circuit can be formed over the glaze film without disconnection of the connecting circuit at the periphery of the glaze film.

8. The ceramic circuit board of claim 7, wherein the difference in level is 20 μm or less.

9. The ceramic circuit board of claim 7, wherein the glaze film has a surface roughness of 0.05 μm Ra or less.

10. The ceramic circuit board of claim 7, wherein the glaze film has a thickness of 30 μm or greater.

11. The ceramic circuit board of claim 7, wherein the ceramic substrate is formed of a glass ceramic consisting essentially of a boron-containing glass and alumina.

12. The ceramic circuit board of claim 11, wherein the boron-containing glass is selected from $Na_2O-Al_2O_3-B_2O_3-SiO_2$, $CaO-Al_2O_3-B_2O_3-SiO_2$, and $MgO-Al_2O_3-B_2O_3-SiO_2$ based glasses.

13. The ceramic circuit board of claim 7, wherein the glaze film is overlaid with a ferromagnetic film or a conductive film.

14. A process for producing a ceramic circuit board having a glaze film on a ceramic substrate, comprising preparing a plurality of ceramic green sheets from a ceramic material which can be sintered at a temperature below 1000° C., laminating the ceramic green sheets under pressure after a through-hole or indentation is formed in the uppermost sheet, thereby forming a multilayer ceramic green substrate having a recess on its top surface, filling the recess with a glaze-forming glass material to such a height that the difference in level between the ceramic substrate and the glaze film formed after firing is 20 μm or less, and co-firing the ceramic green substrate and the glaze-forming glass material at a temperature below 1000° C. to give a ceramic circuit board in which the glaze film is at least partly embedded in the ceramic substrate.

15. The process of claim 14, wherein the ceramic green sheets are formed from a glass ceramic material based on a boron-containing glass powder and an alumina powder.

16. The ceramic circuit board of claim 15, wherein the boron-containing glass is selected from $Na_2O-Al_2O_3-B_2O_3-SiO_2$, $CaO-Al_2O_3-B_2O_3-SiO_2$, and $MgO-Al_2O_3-B_2O_3-SiO_2$ based glasses.

17. The ceramic circuit board of claim 1, wherein a glass-diffused interfacial layer is formed between the ceramic substrate and glaze film.

18. The ceramic circuit board of claim 7, wherein a glass-diffused interfacial layer is formed between the ceramic substrate and glaze film.

* * * * *